US010208922B2

(12) United States Patent
Gommans

(10) Patent No.: US 10,208,922 B2
(45) Date of Patent: Feb. 19, 2019

(54) LIGHTING DEVICE

(71) Applicant: PHILIPS LIGHTING HOLDING B.V., Eindhoven (NL)

(72) Inventor: Hendrikus Hubertus Petrus Gommans, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 296 days.

(21) Appl. No.: 14/900,497

(22) PCT Filed: Jun. 25, 2014

(86) PCT No.: PCT/EP2014/063367
§ 371 (c)(1),
(2) Date: Dec. 21, 2015

(87) PCT Pub. No.: WO2014/207029
PCT Pub. Date: Dec. 31, 2014

(65) Prior Publication Data
US 2016/0369973 A1    Dec. 22, 2016

(30) Foreign Application Priority Data
Jun. 27, 2013    (EP) ..................................... 13173916

(51) Int. Cl.
*F21K 9/60*     (2016.01)
*F21K 9/62*     (2016.01)
(Continued)

(52) U.S. Cl.
CPC .................. *F21V 7/06* (2013.01); *F21K 9/60* (2016.08); *F21K 9/61* (2016.08); *F21K 9/62* (2016.08);
(Continued)

(58) Field of Classification Search
CPC .............. F21K 9/62; G02B 27/30; F21V 7/06
See application file for complete search history.

(56) References Cited

U.S. PATENT DOCUMENTS 7,837,375 B2    11/2010    Watanabe et al.
7,841,739 B2    11/2010    Liu et al.
(Continued)

FOREIGN PATENT DOCUMENTS

| CN | 102003683 A | 4/2011 |
| CN | 201992376 U | 9/2011 |
| JP | 2007018936 A | 1/2007 |
| JP | 2007214475 A | 8/2007 |
| WO | 2002097325 A1 | 12/2002 |
| WO | 2006043195 A1 | 4/2006 |
| WO | 2013005142 A1 | 1/2013 |

*Primary Examiner* — Jong-Suk (James) Lee
*Assistant Examiner* — Eric T Eide
(74) *Attorney, Agent, or Firm* — Akarsh P. Belagodu

(57) ABSTRACT

A lighting device (1) comprising a plurality of light sources (2) each light source of the plurality of light sources being arranged to, in operation, emit light, and first secondary optics (3) and second secondary optics, the first secondary optics being arranged such that the light emitted by the light sources is injected directly into the first secondary optics, the first secondary optics causing light to be emitted in a direction towards the second secondary optics, the secondary optics being a reflective light collimating element (4) having a circumferential surface (43) arranged such as to extend around the plurality of light sources and the first secondary optics, the first secondary optics and the second secondary optics causing the light being emitted by each light source of the plurality of light sources to be mutually substantially overlapping before extraction from the lighting device and the first secondary optics (3) comprising one or more reflecting surface segments (5) for reflecting light back into said first secondary optics and one or more extraction surface segments (6) for extracting light from said first secondary optics.

11 Claims, 3 Drawing Sheets

(51) Int. Cl.
  *F21V 3/00* (2015.01)
  *F21V 7/06* (2006.01)
  *G02B 19/00* (2006.01)
  *F21V 5/04* (2006.01)
  *G02B 5/02* (2006.01)
  *F21K 9/61* (2016.01)
  *F21V 8/00* (2006.01)
  *G02B 27/30* (2006.01)
  *H01L 25/075* (2006.01)
  *H01L 33/50* (2010.01)
  *H01L 33/58* (2010.01)
  *H01L 33/60* (2010.01)
  *F21Y 115/10* (2016.01)

(52) U.S. Cl.
  CPC .................. *F21V 3/00* (2013.01); *F21V 5/04* (2013.01); *F21V 5/046* (2013.01); *G02B 5/0278* (2013.01); *G02B 6/0031* (2013.01); *G02B 6/0043* (2013.01); *G02B 19/0028* (2013.01); *G02B 19/0066* (2013.01); *G02B 27/30* (2013.01); *H01L 25/0753* (2013.01); *H01L 33/502* (2013.01); *H01L 33/58* (2013.01); *H01L 33/60* (2013.01); *F21Y 2115/10* (2016.08); *H01L 2933/0091* (2013.01)

(56) References Cited

U.S. PATENT DOCUMENTS

| | | |
|---|---|---|
| 2006/0291203 A1 | 12/2006 | Anandan |
| 2006/0291207 A1* | 12/2006 | Simon ............... F21V 5/046 362/245 |
| 2008/0144331 A1 | 6/2008 | Xu |
| 2011/0075398 A1 | 3/2011 | Wheatley et al. |
| 2011/0090423 A1 | 4/2011 | Wheatley et al. |
| 2011/0096272 A1 | 4/2011 | Han et al. |
| 2011/0109839 A1* | 5/2011 | Zhu ............... G02F 1/133603 349/62 |
| 2012/0106147 A1 | 5/2012 | Kim et al. |
| 2013/0088142 A1 | 4/2013 | Allen |
| 2013/0094216 A1* | 4/2013 | Sato ............... F21V 7/22 362/297 |
| 2013/0120982 A1* | 5/2013 | Ko ............... F21V 13/02 362/235 |
| 2014/0126216 A1* | 5/2014 | Keser ............... F21V 7/0025 362/296.05 |
| 2015/0003055 A1* | 1/2015 | Lacroix ............... F21V 7/0025 362/231 |
| 2015/0369454 A1* | 12/2015 | Lee ............... G02F 1/133603 362/97.1 |

* cited by examiner

LIGHTING DEVICE

CROSS-REFERENCE TO PRIOR APPLICATIONS

This application is the U.S. National Phase application under 35 U.S.C. § 371 of International Application No. PCT/EP2014/063367, filed on Jun. 25, 2014, which claims the benefit of European Patent Application No. 13173916.1, filed on Jun. 27, 2013. These applications are hereby incorporated by reference herein.

FIELD OF THE INVENTION

The invention relates to a lighting device comprising a plurality of light sources, each light source of the plurality of light sources being arranged to emit light, and a first and a second secondary optics.

BACKGROUND OF THE INVENTION

In prior art lighting devices it is known to position one or more light sources behind a screen such that the observer cannot distinguish the individual light emitting light sources. The most obvious example is a diffusing screen or sphere that obscures the direct image of the light emitting light sources.

Nowadays, with the increased use of LEDs in lighting devices a direct view of the light source is hardly ever appreciated and masking LED sources is generally an integral part of the development of LED-based lighting devices. Using diffusers in a manner similar to how it was done in connection with other light sources, such as light bulbs, is known.

However, such a straightforward implementation suffers from several drawbacks. For a diffuser to effectively mask the sources the distance to the sources should be comparable to or larger than the pitch of the LEDs. The luminaire form factor is thus largely determined by this LED masking. As LEDs become more efficient, the number of LEDs is reduced and as a result the pitch increases. It is desirable that the luminaire form factor is independent of the LED pitch. In addition, in case of LED failure a dark area on the diffusing screen will appear, in which case the whole lighting module needs to be replaced.

Furthermore, a high degree of collimation is required particularly for spotlight applications. A diffusing screen, however, modifies and even limits the degree of collimation required for spotlights, and hence is not considered an ideal solution to mask the individual sources.

US 2006/0291203 A1 describes an attempt at solving the above problems by means of a light mixing module in which a red, a green and a blue LED is arranged in a reflective small package, the light emitted from the LEDs being reflected from the walls of the small package and thus being mixed. Further mixing is obtained by means of a fiber bundle arranged extending from the light exit surface of the small package.

Although the individual light sources are thereby masked, this solution, however, still gives the viewer the impression of several light sources as each fiber of the fiber bundle provides a separate light spot. Furthermore, this solution does not solve the problem of providing collimation of the light in a degree sufficient for instance for spot light applications.

Therefore there is a need to provide a lighting device emitting light with a luminance that gives the observer the impression that only one single light source is present in the lighting device. Furthermore it is preferred that the user may choose a light source having a shape or form of his liking, for instance a uniform disc or an o-ring shape. This should be done in such a way that the image of the source is independent of the actual number of light sources, preferably LEDs, present in the lighting device. Also, the form factor should preferably be independent of the LED pitch and/or be minimized and the degree of collimation should preferably not be compromised or be compromised minimally.

SUMMARY OF THE INVENTION

It is an object of the present invention to overcome these problems and to provide a lighting device with which the individual light sources of the lighting device are masked, with which the form factor is minimized and with which a high degree of collimation is achieved.

According to a first aspect of the invention, this and other objects are achieved by means of a lighting device as described initially and comprising a first secondary optics and a second secondary optics, the first secondary optics being arranged such that the light emitted by the light sources is injected directly into the first secondary optics, the first secondary optics causing light to be emitted in a direction towards the second secondary optics, the secondary optics being a reflective light collimating element having a circumferential surface arranged such as to extend around the plurality of light sources and the first secondary optics, the first secondary optics and the second secondary optics causing the light being emitted by each light source of the plurality of light sources to be mutually substantially overlapping before extraction from the lighting device and the first secondary optics comprising one or more reflecting surface segments for reflecting light back into said first secondary optics and one or more extraction surface segments for extracting light from said first secondary optics.

By providing a light source with a second secondary optics according to the invention the light emitted by the lighting device is provided with a high degree of collimation.

By providing a light source with a first secondary optics and a second secondary optics according to the invention the combined influence of the first and second secondary optics provides the light emitted by the lighting device with such a light distribution or luminance distribution that the light source image as percieved by a viewer is made independent of the real number of LEDs in the module, while obtaining this effect in a manner such that the form factor is minimized. In this way, if one of the light sources fails, a viewer will merely perceive the failure as a change in intensity.

Simultaneously, the first secondary optics may even provide a contribution to improving the degree of collimation of the light emitted by the lighting device, and in any event only compromises the degree of collimation to a very limited extent or even not at all.

Thereby a lighting device with which the individual light sources of the lighting device are masked, with which the form factor is minimized and with which a high degree of collimation is provided.

By providing the first secondary optics comprising one or more reflecting surface segments for reflecting light back into said first secondary optics and one or more extraction surface segments for extracting light from said first secondary optics a lighting device is provided in which the shaping of the light emitted by the plurality of light sources is sub-divided into a first process taking place exclusively within the first secondary optics before extraction and a second process taking place exclusively within the second secondary optics after extraction. This in turn provides for a lighting device emitting light of a particularly high quality in view of ordinary lighting applications.

As used herein the term "secondary optics" is in its broadest sense intended to cover optical elements having the only function or main function of shaping light emitted by a light source such as to create the demanded or desired appearance and beam pattern of the lighting device according to its application. This meaning of the term "secondary optics" is generally known to the skilled person in the field of LED optics.

Also, the term "a plurality of light sources" as used throughout this description is thus meant to in principle encompass any type or combination of types of light source and light sources in any number greater than one. Particularly, however, the term "a plurality of light sources" is meant to encompass any type or combination of types of point light source and point light sources in any number greater than one.

In an embodiment the reflective light collimating element further comprises a substantially flat bottom surface, the circumferential surface extending from the bottom surface.

Thereby a substantially flat surface is provided, on which the first secondary optics and the plurality of light sources may be mounted in a particularly simple and robust manner.

In an embodiment the reflective light collimating element comprises a plurality of surface segments constituting the circumferential surface.

Thereby a lighting device is provided with which the collimating properties of the second secondary optics may be adjusted in such a way that different surface segments comprise different collimating properties, which in turn provides for an improved degree of collimation of the light emitted by the lighting device.

In an embodiment the lighting device comprises a diffuse extraction plate embedded in or constituting at least a part of a top face of the reflective light collimating element.

Thereby a lighting device is provided with which the light emitted by the lighting device comprises a particularly uniform luminance.

Furthermore, and as will be described in further detail below, different shapes of diffuse extraction plates (where present), different shapes of the top face and/or parts of the top face of the second secondary optics not being transparent, may provide the observer with the impression of different shapes of the spot of light emitted by the lighting device. In this way it is possible to provide the observer with the impression of e.g. circular, elliptic, ring-shaped or even angular light spots.

In an embodiment the circumferential surface connects the bottom surface and the top face.

Thereby a lighting device is provided comprising a second secondary optics of a particularly simple and robust structure.

In an embodiment the circumferential surface is a parabolic circumferential surface.

Thereby a second secondary optics having particularly good collimating properties may be obtained.

In an embodiment the first secondary optics is any one of:
a light mixing module in which the plurality of light sources are arranged, and
at least one optical element adapted for exercising a collimating effect on light travelling therethrough, having at least one surface, at which incident light is exposed to total internal reflection (TIR) and being arranged in contact with or in a direct vicinity of at least one of the plurality of light sources.

By providing a light source with a first secondary optics in the form of a light mixing module, mixing of the light emitted by the individual light sources may be obtained in a particularly simple and efficient way.

By providing a light source with a first secondary optics in the form of at least one optical element according to the invention, a particularly high degree of collimation of the light emitted by the lighting device may be obtained in a particularly simple and efficient way without compromising the mixing effect obtained by the influence of the first and second secondary optics in combination on the light emitted by the individual light sources.

In an embodiment the first secondary optics is a light mixing module, the light mixing module comprising a light guide and a reflective element arranged along a rim of the light guide, the reflective element comprising one or more reflecting surface segments for reflecting light back into the light guide, one or more openings being provided in the reflective element, the one or more openings forming one or more extraction surface segments for extracting mixed light from the light mixing module.

Thereby a lighting device is provided comprising a first secondary optics which provides for efficient and thorough mixing of the light emitted by the individual light sources, and which simultaneously comprises a simple structure.

In an embodiment the first secondary optics is a light mixing module, the light mixing module comprising a light guide and a reflective element arranged along a rim of the light guide and providing one or more reflective surface segments for reflecting light back into the light guide, a surface adjacent to the rim of the light guide forming one or more extraction surface segments for extracting mixed light from the light mixing module.

Thereby a lighting device is provided comprising a first secondary optics which provides for efficient and thorough mixing of the light emitted by the individual light sources, and which simultanously comprises a very simple structure which is easy to manufacture.

In an embodiment a plurality of scattering dots are arranged on a surface of the first secondary optics. This embodiment is particularly preferred in the case of the first secondary optics being a mixing module.

By providing such scattering dots the mixing effect of the first secondary optics is enhanced, thereby improving the quality of the image of the light emitted by the lighting device as perceived by a viewer.

In another embodiment the first secondary optics is at least one optical element adapted for exercising a collimating effect on light travelling therethrough, each of the at least one optical elements having at least one first surface part at which incident light is exposed to total intenal reflection (TIR), the at least one first surface part constituting one or more reflecting surface segments for reflecting light back into the at least one optical element, and at least one second surface part constituting one or more extraction surface segments for extracting light from the at least one optical element.

Thereby a lighting device is provided comprising a first secondary optics having a very simple structure and providing a particularly high degree of collimation of the light emitted by the lighting device without compromising the mixing effect, which in this case is obtained by the influence of the first and second secondary optics in combination on the light emitted by the individual light sources.

In an embodiment the plurality of light sources comprise any one or more of a phosphor layer and a scattering surface layer.

In an embodiment the at least the parabolic surface of the light collimating element is made of a metal.

In an embodiment at least the parabolic surface of the light collimating element comprises a metallic coating or film arranged on an inner surface thereof.

Whether being of a metal or provided with a metallic coating or film, the parabolic surface of the light collimating element is thereby provided with particularly good light reflecting properties, thus ensuring a minimum loss of light due to absorption. Preferably, the plurality of light sources is any one or more of a plurality of point light sources, a plurality of LEDs, a plurality of phosphor-converted LEDs, a LED-array and a phosphor-converted LED-array.

It is noted, that although the invention is in particular directed towards applications employing LEDs of any feasible type as light sources, the use of other types of light sources is also feasible.

It is noted that the invention relates to all possible combinations of features recited in the claims.

BRIEF DESCRIPTION OF THE DRAWINGS

These and other aspects of the present invention will now be described in more detail, with reference to the appended drawings showing embodiment(s) of the invention.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
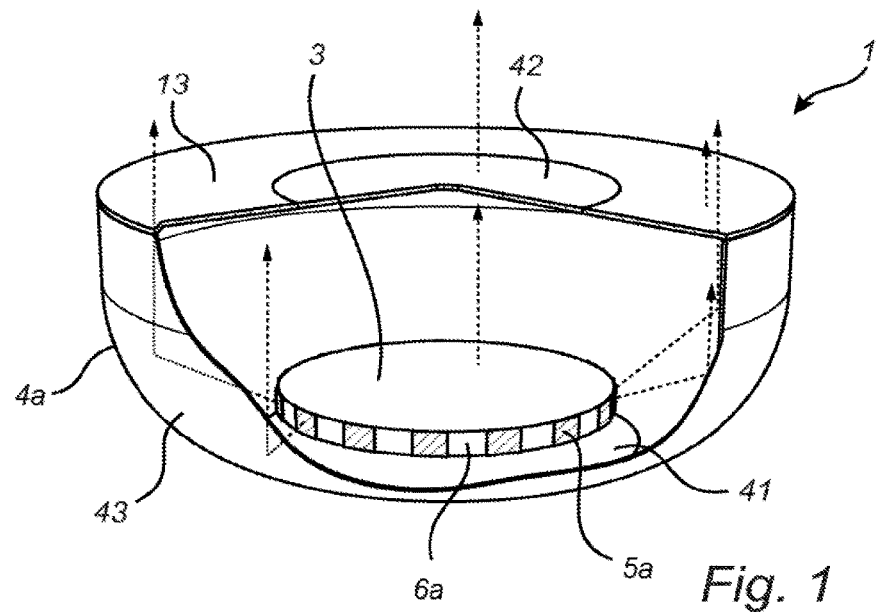
FIG. 1 shows a schematic illustration of a first embodiment of a lighting device according to the invention comprising first and second secondary optics, the first secondary optics being a light guide with a reflective element.

FIG. 1 shows a first embodiment of a lighting device 1 according to the invention. The lighting device 1 comprises a first secondary optics 3 arranged adjacent a plurality of light sources 2. More precisely, the first secondary optics 3 is arranged such that the light emitted by the plurality light sources 2 is injected directly into the first secondary optics 3 and that the first secondary optics 3 causes light to be emitted therefrom in a direction towards a second secondary optics 4. The light sources 2 are not shown explicitly on FIG. 1, but are arranged within the first secondary optics 3. The lighting device further comprises a second secondary optics 4a arranged such as to surround the plurality of light sources 2 and the first secondary optics 3. Alphabetic suffixes ('a', 'b', 'c') are appended to reference numerals of certain components disclosed herein to distinguish between the various embodiments shown in the drawings, however, reference made to a reference numeral without use of the alphabetic suffix shall be generally applicable irrespective of embodiment.

Figure 2:
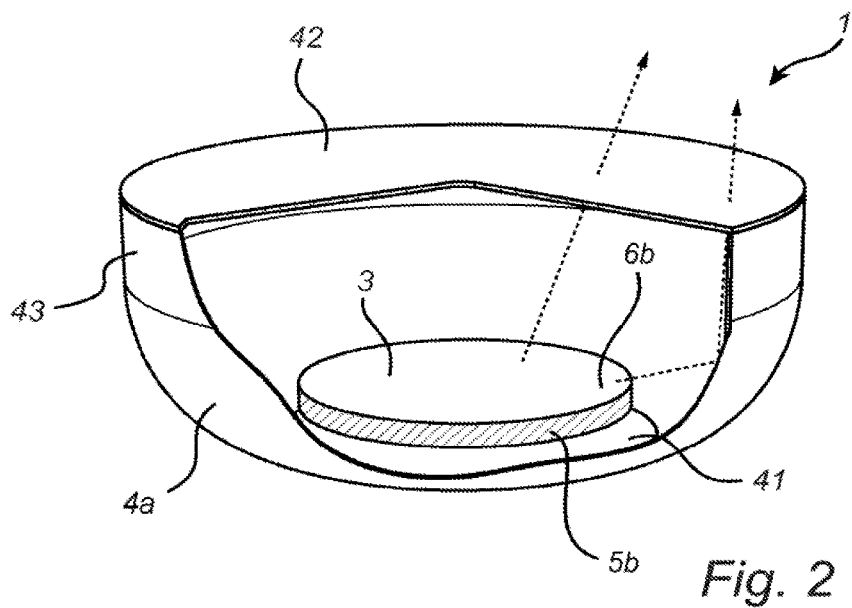
FIG. 2 shows a schematic illustration of a lighting device according to FIG. 1 and comprising first and second secondary optics, the first secondary optics being a light guide with a reflective element in an embodiment differing from that of FIG. 1.
Figure 5:
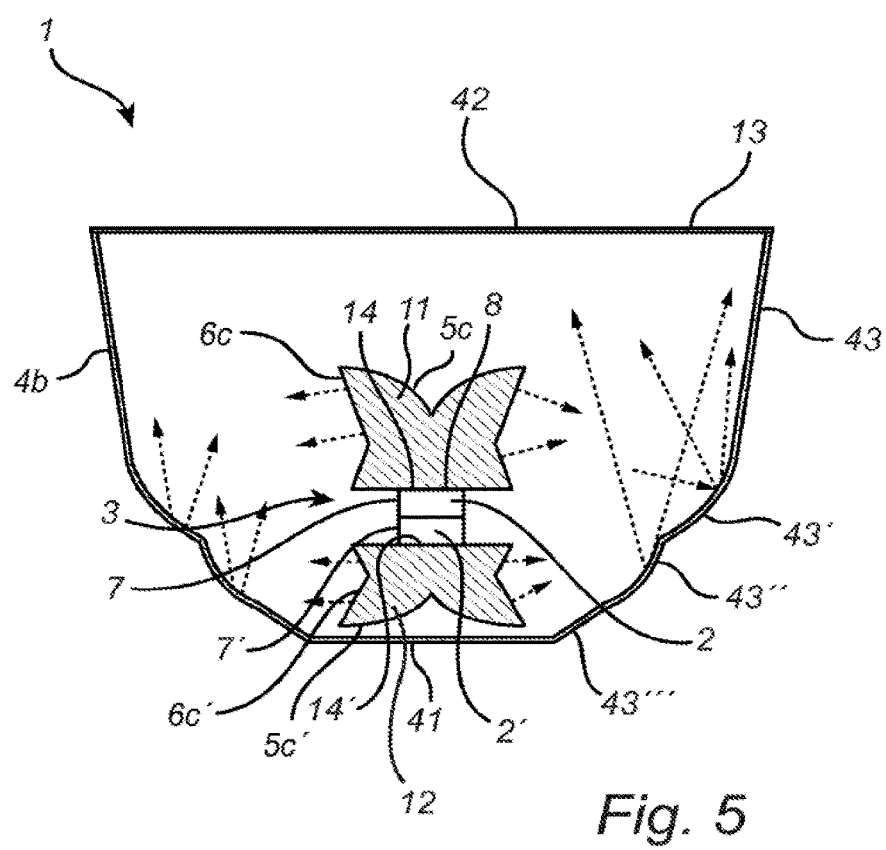
FIG. 5 shows a schematic illustration of a second embodiment of a lighting device according to the invention comprising first and second secondary optics, the first secondary optics being two collimating elements.

It is noted that the dashed arrows shown in FIG. 1 and likewise in FIGS. 2 and 5 indicate parts of the light paths through the lighting device 1.

Generally speaking, and irrespective of the embodiment, the first secondary optics 3 and the second secondary optics 4 are adapted to cause light being emitted by said plurality of light sources 2 and having interacted with the first secondary optics 3 and the second secondary optics 4 to be substantially or completely mutually overlapping before extraction from the lighting device 1. Thereby the resulting light emitted by the lighting device 1 is provided with a uniform luminance and is thus experienced as uniform by an external viewer.

The second secondary optics 4 is generally a reflective light collimating element 4 with a circumferential surface 43. In the embodiment shown the light collimating element 4 is a casing with a parabolic circumferential surface 43, a substantially flat bottom surface 41 and a top face 42. The circumferential surface 43 may, however, also take up other shapes than parabolic, e.g. cylindrical, conical, frustoconical or even hyperboloid.

The parabolic surface 43 is a circumferential or substantially circumferential surface such as to extend all or substantially all of the way around the plurality of light sources 2 and the first secondary optics 3.

The parabolic circumferential surface 43 is made of a material reflecting most or preferably all incident light. To this end the parabolic circumferential surface 43 may e.g. be made of a metal or be provided with a reflective coating or film, e.g. a metallic coating or film. Alternatively, the parabolic circumferential surface 43 may in principle be a mirror. The bottom surface 41 may be made in one piece with the parabolic circumferential surface 43, or it may in principle even be omitted.

The top face 42 may be partially or even fully covered by a partially or fully transparent optical element, such as a diffuser 13, which in FIG. 1 is shown covering part of the top face 41. Alternatively, the top face 41 may be an open top face or a top face having one or more parts which are non-transparent.

Generally speaking, and irrespective of the embodiment, the first secondary optics 3 comprises one or more reflecting surface segments 5 for reflecting light back into the first secondary optics 3 and one or more extraction surface segments 6 for extracting light from the first secondary optics 3. Reflecting surface segments 5a are illustrated in FIGS. 1 and 3, reflecting surface segment 5b is illustrated in FIGS. 2 and 4, and reflecting surface segments 5c and 5c' are illustrated in FIG. 5.

Figure 3:
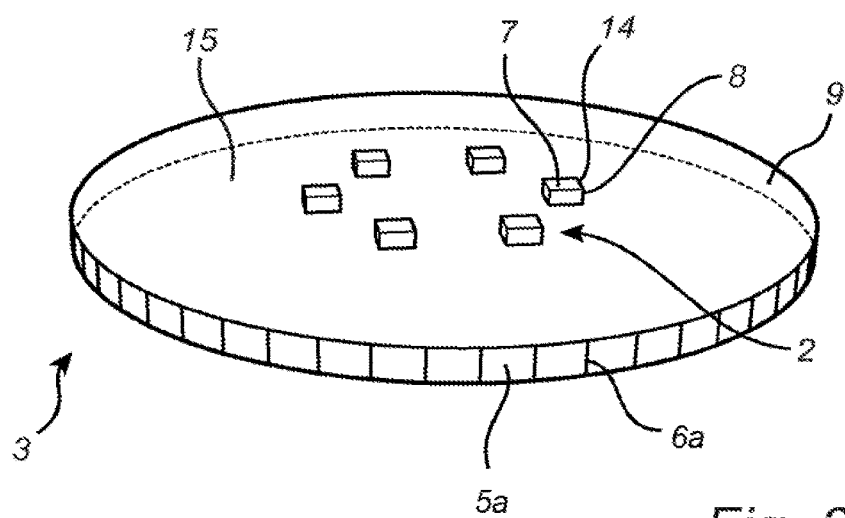
FIG. 3 shows a schematic illustration of the first secondary optics of a lighting device according to FIG. 1.
Figure 4:
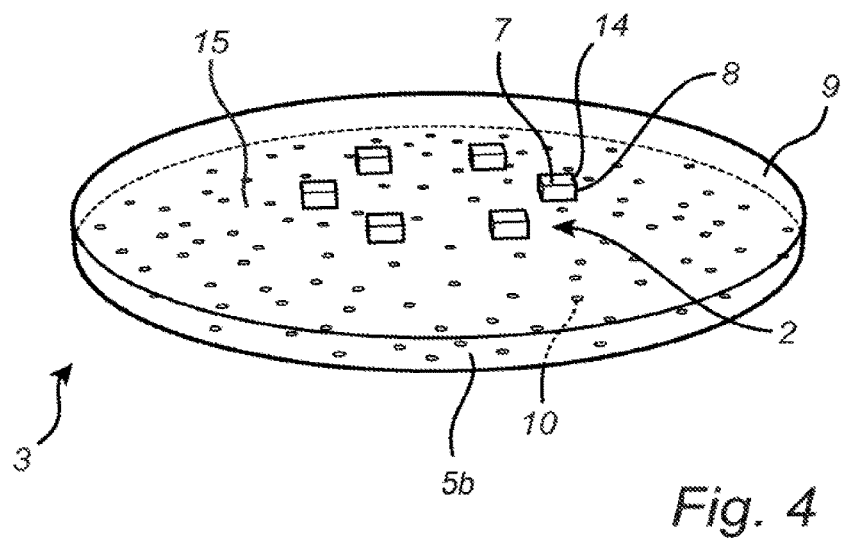
FIG. 4 shows a schematic illustration of the first secondary optics of a lighting device according to FIG. 2.

The first secondary optics 3 of the lighting device 1 of FIG. 1 is shown in more detail in FIG. 3. In this embodiment the first secondary optics 3 is a light mixing module made e.g. of poly(methyl methacrylate) (PMMA). The light mixing module comprises a light guide 15 and reflective element 9. The light guide 15 is adapted for emitting light through its side surface. The reflective element 9 is arranged along a rim of the light guide 15.

One or more openings are provided in the reflective element 9. The one or more openings form one or more extraction surface segments 6a for extracting mixed light from the light mixing module. The segments of the reflective element 9 between or surrounding the one or more openings form one or more reflecting surface segments 5. The one or more openings are positioned in such a manner that light extracted from the first secondary optics 3 comprises a high degree of uniformity irrespective of the number of light sources 2 provided. One way of obtaining this is to distribute a plurality of openings uniformly over the surface of the reflective element 9. As a high degree of reflection of the reflective element 9 is preferable, the one or more extraction surface segments 6 preferably take up as small an area of the reflective element 9 as possible. Also, it is noted that the one or more extraction surface segments 6a may in principle have any suitable shape and/or orientation on the reflective element 9, such as e.g. in the height or length direction of the reflective element or any combination thereof.

Preferably, the reflective element 9 is a metallic foil, film or coating arranged on the rim of the light guide 15. However, other types of reflective elements, such as e.g. a mirror or a mirror coating, are likewise feasible.

In this way light is emitted from the first secondary optics 3 shown in FIGS. 1 and 3 in the shape of a ring.

Preferably, and as shown on FIGS. 1 and 3, the light guide 15 is disc shaped, such that the light source is experienced by a viewer as circular or round. However, the light guide is not limited to being disc shaped, but may just as well take up any other feasible geometrical shape such as rectangular, triangular, elliptical, annular or the like.

In FIG. 3 six light sources 2 are shown, each of the six light sources emitting light. Each light source 2 comprises a scattering surface 7 and an injection surface 14. Light emitted by a light source 2 is scattered at the scattering surface 7 and injected into the light guide 15 through the injection surface 14. Each light source 2 may further comprise a phosphor surface 8, such as a phosphor layer, a phosphor element or a phosphor coating. Light emitted by a light source 2 and inciding on the posphor surface 8 causes the phosphor surface 8 to emit light at other, particularly longer, wavelengths than the light source 2, thus providing for emission in the substantially full range of visible light. Thus, the phosphor surface 8 is preferably arranged at or on the light emitting surface of the light source 2.

In the embodiment shown in FIGS. 3 and 4, the injection surface 14 is a side surface of the light source 2, the scattering surface 7 is a top surface and the phosphor surface 8 is a bottom surface, which is hidden in FIGS. 3 and 4, opposite the scattering surface 7. However, other arrangements of the injection surface, scattering surface and phosphor surface are feasible.

It is noted that the lighting device 1, irrespective of the embodiment, is not limited to comprising six light sources 2. Hence, a lighting device 1 according to the invention may comprise any number of light sources greater than one.

Also irrespective of the embodiment, the plurality of light sources are preferably a plurality point light sources, most preferably a plurality of LEDs, but may alternatively just as well be a plurality of phosphor-converted LEDs, a LED-array or a phosphor-converted LED-array.

FIG. 2 shows a lighting device 1 according to the invention and being identical to the lighting device according to FIG. 1 with the exception of the embodiment of the first secondary optics 3. Thus, the lighting device 1 comprises a first secondary optics 3 arranged adjacent a plurality of light sources 2. More precisely, the first secondary optics 3 is arranged such that the light emitted by the plurality light sources 2 is injected directly into the first secondary optics 3 and that the first secondary optics 3 causes light to be emitted therefrom in a direction towards a second secondary optics 4a. The light sources 2 are not shown explicitly on FIG. 2, but are arranged within the first secondary optics 3. The lighting device 1 further comprises a second secondary optics 4a arranged such as to surround the plurality of light sources 2 and the first secondary optics 3.

The first secondary optics 3 shown in FIG. 2 comprises one reflecting surface segment 5b for reflecting light back into the first secondary optics 3. The rim of the first secondary optics constitutes the first surface segment 5b. The first secondary optics 3 shown in FIG. 2 further comprises one extraction surface segment 6b for extracting light from the first secondary optics 3. A horizontal surface of the first secondary optics 3 constitutes the second surface segment 6b.

The first secondary optics 3 of the lighting device 1 of FIG. 2 is shown in more detail in FIG. 4. The light sources 2 are identical to those described in relation to FIG. 3.

The first secondary optics 3 shown in FIGS. 2 and 4 is a mixing module comprising a light guide 15 and a reflective element 9 arranged along a rim of the light guide 15. The reflective element 9 provides one or more reflective surface segments 5b for reflecting light back into the light guide 3. A surface of the light guide 15 adjacent to the rim, particularly a horizontally arranged top surface of the light guide 15, forms one or more extraction surface segments 6 for extracting mixed light from the light guide 15.

Furthermore, a plurality of scattering dots 10 are arranged on a surface of the light guide 15, in FIG. 4 the surface opposite the surface forming the surface segment 6b, for scattering of the light emitted by the light sources 2. In this way light is emitted from the first secondary optics 3 shown in FIGS. 2 and 4 in the shape of a disc, particularly a large surface area disc.

Turning now to FIG. 5, a second embodiment of a lighting device 1 according to the invention is shown. The lighting device 1 comprises a plurality of light sources 2, a first secondary optics 3 and a second secondary optics 4b.

The second secondary optics 4b is identical to that described above in relation to FIGS. 1 and 2 with one exception that will be described further below. The second secondary optics 4b of the second embodiment of the invention may also be provided with optional features similar to those described above in relation to FIGS. 1 and 2, such as e.g. a diffuser 13 arranged in the top face 42 or constituting the top face 42 of the second secondary optics 4b.

The second secondary optics 4b shown in FIG. 5 is provided with a parabolic surface 43 which comprises a plurality of surface segments, in the embodiment shown four surface segments 43, 43', 43", 43'''.

Each or some of the surface segments 43, 43', 43", 43''' may be parabolic, or the surface segments may be of another shape, e.g. substantially flat, and joined together such as to form a parabolic surface or a circumferential surface of another suitable shape such as cylindrical, conical, frusto-conical or even hyperboloid.

Preferably, surface segments, e.g. the surface segments 43", 43''' shown in FIG. 5, located farther away from the top face 42 are adapted or arranged such as to have a higher collimating effect on light incident thereon as compared to surface segments, e.g. the surface segments 43, 43' shown in FIG. 5, closer to the top face 42. This may be obtained by choosing a suitable curvature of each surface segment 43, 43', 43'', 43''' and/or by arranging each surface segment 43, 43', 43'', 43''' in a suitable angle with respect to the first secondary optics 3.

The first secondary optics 3 of the second embodiment of the invention is generally provided as at least one optical element 11, 12 adapted for exercising a collimating effect on light travelling therethrough.

In the particular embodiment shown in FIG. 5 two such optical elements 11 and 12 are provided, one for each of the two light sources 2 and 2' present.

Each optical element 11, 12 comprises at least one first surface part at which incident light is exposed to total internal reflection (TIR). The at least one first surface part constitutes one or more reflecting surface segments 5c, 5c' for reflecting light back into the at least one optical element 11, 12. Each optical element 11, 12 further comprises at least one second surface part. The at least one second surface part constitutes one or more extraction surface segments 6c, 6c' for extracting light from said at least one optical element 11, 12.

As mentioned, in FIG. 5 two light sources 2 and 2' are shown, each of the light sources emitting light. Each light source 2, 2' comprises a scattering surface 7, 7' and an injection surface 14, 14'. Light emitted by a light source 2, 2' is scattered at the scattering surface 7, 7' and injected into corresponding optical element 11 or 12 through the injection surface 14, 14'. Each light source 2, 2' further comprises a phosphor surface, of which only the phosphor surface 8 of the light source 2 is indicated on FIG. 5, such as a phosphor layer, a phosphor element or a phosphor coating. Light emitted by a light source 2 and inciding on the phosphor surface 8 causes the phosphor surface 8 to emit light at other, particularly longer, wavelengths than the light source 2, thus providing for emission in the substantially full range of visible light.

In the embodiment shown in FIG. 5, the injection surface 14 is a top surface of the light source 2, the scattering surface 7 is a side surface and the phosphor surface 8 is located on or adjacent to the same surface as the injection surface 14. However, other arrangements of the injection surface, scattering surface and phosphor surface are feasible, and likewise other corresponding arrangements of the first secondary optics 3 are feasible.

In the following the general function of a lighting device 1 according to the invention will be described by means of explaining how light is directed through the components of the lighting device 1.

Firstly, light is emitted by each of the plurality of light sources 2.

The emitted light is scattered at the at least one scattering surface 7 of the light source 2 and is injected through the at least one injection surface 14 into the first secondary optics 3 in which the emitted light is collimated and/or mixed.

In the first embodiment shown in FIGS. 1 and 2, light is primarily mixed in the first secondary optics 3, while in the second embodiment shown in FIG. 5 light is primarily or only collimated in the first secondary optics 3.

As described above, the first secondary optics 3 comprises an outer surface with one or more reflecting surface segments 5 and one or more extraction surface segments 6. Hence, in the first secondary optics 3 light is reflected at the reflective surface segments 5 and mixed and/or collimated light is extracted through the extraction surface segments 6 and emitted towards the second secondary optics 4, and particularly towards the parabolic surface 43 thereof.

The light extracted from the first secondary optics 3 is then collimated by interaction with the second secondary optics 4, and particularly by reflection off of the parabolic surface 43 thereof, and is reflected towards the top face 42 of the second secondary optics 4. Particularly, in the second embodiment described with reference to FIG. 5, the light extracted from the first secondary optics 3 is not only further collimated but is also mixed by interaction with the second secondary optics 4b, and particularly by reflection off of the parabolic surface 43 thereof.

Finally, the thus mixed and collimated light is emitted from the top face 42 of the second secondary optics 4, possibly through a diffusing extraction surface such as a diffuser 13 as described above.

In this manner a lighting device 1 according to the invention emits light with a luminance which at the top face 42 of the second secondary optics 4 is made up of a plurality of overlapping light beams stemming from the plurality of light sources 2. Thereby it is obtained that the emitted light comprises a uniform luminance, and that a viewer looking at the light emitted by the lighting device 1 will not be able to discern the individual light sources 2 from one another. Furthermore, in the event that one of the light sources 2 is absent, e.g. malfunctions, this will not alter the beam profile of the lighting device and will thus not be noticed by the viewer.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain measures are recited in mutually different dependent claims does not indicate that a combination of these measures cannot be used to advantage.

The invention claimed is:
1. A lighting device comprising:
  a plurality of light sources, each light source of said plurality of light sources being arranged to, in operation, emit light from an injection surface, and
  first secondary optics and second secondary optics, said first secondary optics is a light mixing module comprising a light guide having a surface formed as a rim parametrically arranged about said light guide and spanning between a top surface of the light guide and a bottom surface of the light guide,
  said plurality of light sources being arranged within said first secondary optics,
  said first secondary optics being arranged such that said light emitted by said light sources is injected directly into said first secondary optics via said injection surfaces, said injection surfaces being side surfaces of said light sources that face toward said rim of said first secondary optics, said first secondary optics causing light to be emitted in a direction from said rim towards said second secondary optics,
  said second secondary optics being a reflective light collimating element having a circumferential surface arranged such as to extend around said plurality of light sources and said first secondary optics,
  said first secondary optics and said second secondary optics causing said light being emitted by each light source of said plurality of light sources to be mutually substantially overlapping before extraction from said lighting device, and said first secondary optics comprising one or more reflecting surface segments formed on said rim for reflecting light back into said first secondary optics and one or more extraction surface segments for emitting said light from said first secondary optics in said direction toward said second secondary optics wherein the one or more reflecting surface segments and the one or more extraction surface segments comprise a plurality of segments formed on the rim that alternate parametrically about the rim.

2. The lighting device according to claim 1, wherein the reflective light collimating element further comprises a substantially flat bottom surface, said circumferential surface extending from said bottom surface.

3. The lighting device according to claim 1, wherein the reflective light collimating element comprises a plurality of surface segments constituting said circumferential surface.

4. The lighting device according to claim 1, wherein the lighting device comprises a diffuse extraction plate constituting at least a part of a top face of said reflective light collimating element.

5. The lighting device according to claim 4, wherein said circumferential surface connects said bottom surface and said top face.

6. The lighting device according to claim 1, wherein said circumferential surface is a parabolic circumferential surface.

7. The lighting device according to claim 1, wherein a plurality of scattering dots are arranged on a surface of the first secondary optics.

8. The lighting device according to claim 1, wherein said plurality of light sources comprise any one or more of a phosphor layer and a scattering surface layer.

9. The lighting device according to claim 1, wherein at least said parabolic surface of said light collimating element is made of a metal, or comprises a metallic coating or film arranged on an inner surface thereof.

10. The lighting device according to claim 1, wherein the plurality of light sources is any one or more of a plurality of point light sources, a plurality of LEDs, a plurality of phosphor-converted LEDs, a LED-array and a phosphor-converted LED-array.

11. The lighting device according to claim 1, wherein the top surface of the light guide faces toward an output direction of the second secondary optics and the top surface of the light guide comprises the one or more extraction surface segments.

* * * * *